US009036330B2

(12) United States Patent
Lee et al.

(10) Patent No.: US 9,036,330 B2
(45) Date of Patent: May 19, 2015

(54) MULTILAYER CHIP CAPACITOR AND METHOD OF FABRICATING THE SAME

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 603 days.

(21) Appl. No.: 12/650,134

(22) Filed: Dec. 30, 2009

(65) Prior Publication Data

US 2010/0238605 A1    Sep. 23, 2010

(30) Foreign Application Priority Data

Mar. 17, 2009    (KR) .................. 10-2009-0022578

(51) Int. Cl.
*H01G 4/005*    (2006.01)
*H01G 4/228*    (2006.01)
(Continued)

(52) U.S. Cl.
CPC ............... *H01G 4/232* (2013.01); *H01G 2/065* (2013.01); *H01G 4/30* (2013.01); *H05K 1/0231* (2013.01); *H05K 1/0295* (2013.01); *H05K 1/181* (2013.01);
(Continued)

(58) Field of Classification Search
CPC ........ H01G 4/30; H01G 4/1227; H01G 4/232
USPC .............. 361/321.1, 321.2, 321.3, 306.3, 303
See application file for complete search history.

(56) References Cited

U.S. PATENT DOCUMENTS 6,765,781 B2    7/2004  Togashi
7,088,569 B1    8/2006  Togashi et al.
(Continued)

FOREIGN PATENT DOCUMENTS

JP    58-138325 U    9/1983
JP    2001-210544 A    8/2001
(Continued)

OTHER PUBLICATIONS

Korean Office Action, with English translation, issued in Korean Patent Application No. 10-2009-0022578, mailed Jan. 19, 2011.
(Continued)

*Primary Examiner* — Eric Thomas
*Assistant Examiner* — Arun Ramaswamy
(74) *Attorney, Agent, or Firm* — McDermott Will & Emery LLP

(57) ABSTRACT

A multilayer chip capacitor includes: a capacitor main body; a plurality of first and second inner electrodes; and m (m≥3) number of first and second outer electrodes. The plurality of first and second inner electrodes are connected with two outer electrodes positioned on both opposing surfaces and having the same polarity as that of the first and second inner electrodes, and classified into a plurality of groups depending on the locations of the outer electrodes connected to the first and second inner electrodes. At least one of two outer electrodes connected with inner electrodes of each group is different from an outer electrode connected with inner electrodes of a different group having the same polarity, and inner electrodes of one group are connected to outer electrodes connected with at least another one group so that all the inner electrodes belonging to the same polarity can be electrically connected.

7 Claims, 8 Drawing Sheets

(51) Int. Cl.
*H01G 4/06* (2006.01)
*H01G 4/232* (2006.01)
*H01G 2/06* (2006.01)
*H01G 4/30* (2006.01)
*H05K 1/02* (2006.01)
*H05K 1/18* (2006.01)

(52) U.S. Cl.
CPC ............... *H05K 2201/0979* (2013.01); *H05K 2201/09954* (2013.01)

(56) References Cited

U.S. PATENT DOCUMENTS

| | | | |
|---|---|---|---|
| 7,145,429 B1 * | 12/2006 | Togashi et al. | 336/200 |
| 7,283,348 B2 * | 10/2007 | Togashi et al. | 361/321.2 |
| 7,616,427 B2 * | 11/2009 | Takashima et al. | 361/321.2 |
| 7,859,820 B2 * | 12/2010 | Togashi | 361/306.3 |
| 2006/0164789 A1 | 7/2006 | Togashi et al. | |
| 2007/0109717 A1 | 5/2007 | Lee et al. | |
| 2008/0165469 A1 * | 7/2008 | Lee et al. | 361/306.3 |
| 2009/0034154 A1 | 2/2009 | Lee et al. | |

FOREIGN PATENT DOCUMENTS

| | | |
|---|---|---|
| JP | 2007-142414 A | 6/2007 |
| JP | 2007-250973 | 9/2007 |
| JP | 2008-199047 A | 8/2008 |
| JP | 2009-044119 A | 2/2009 |
| KR | 10-2006-0082795 A | 7/2006 |
| KR | 10-2007-052656 | 5/2007 |
| KR | 10-2008-079125 | 8/2008 |

OTHER PUBLICATIONS

Japanese Office Action, with English translation, issued in Japanese Patent Application No. 2009-298040, dated Nov. 22, 2011.

* cited by examiner

MULTILAYER CHIP CAPACITOR AND METHOD OF FABRICATING THE SAME

CROSS-REFERENCE TO RELATED APPLICATIONS

This application claims the priority of Korean Patent Application No. 10-2009-0022578 filed on Mar. 17, 2009, in the Korean Intellectual Property Office, the disclosure of which is incorporated herein by reference.

BACKGROUND OF THE INVENTION

1. Field of the Invention

The present invention relates to a multilayer chip capacitor and, more particularly, to a circuit board device having a decoupling multilayer chip capacitor capable of allowing a user to personally (directly) adjust an equivalent series resistance (ESR).

2. Description of the Related Art

In general, a multilayer chip capacitor (MLCC) has a structure in which inner electrodes of different polarities are alternately stacked between a plurality of dielectric layers. The MLCC is commonly used as a component of various electronic devices with the advantages that it is small, guarantees a high capacity, and is easily mounted.

In particular, a power supply device for a central processing unit (CPU) of a computer or the like has a problem in that a voltage noise is generated due to a rapid change in a load current in the process of providing a low voltage. Thus, in order to restrain such voltage noise, the MLCC is widely used as a decoupling capacitor for the power supply device.

As the operational frequency increases, the decoupling multilayer chip capacitor needs to have ESR characteristics in order to more stably provide power.

If the ESR value of the multilayer chip capacitor is lower than a required level, an impedance peak at a parallel resonance frequency generated due to an equivalent series inductance (ESL) of a capacitor and a plane capacitance of a microprocessor package increases, while the impedance at a series resonance frequency of the capacitor is excessively lowered. Thus, in order for the user to implement the flat impedance characteristics of a power distributed network, it is desirous to easily adjust the ESR characteristics of the decoupling multilayer capacitor and provide it.

Regarding ESR adjustment, a method of forming outer electrodes and inner electrodes with a material having a high electrical resistance may be considered. In this case, however, if the highly resistant material is used for the outer electrodes, a localized heat spot can be caused by a current concentration phenomenon due to a pin hole. In addition, when the inner electrodes are made of a high resistant material, the material of the inner electrodes must be continuously altered so as to be matched with a ceramic material in line with the high capacity.

Another method for improving ESR is disclosed by U.S. Pat. No. 6,765,781 (Assignee: TDK) in which a linkage electrode is applied to the exterior of a capacity main body to connect inner electrodes in series through the leakage electrode.

However, the above-described ESR adjustment methods are disadvantageous in that they are all executed by the manufacturers. Namely, the electrode structure is modified to be designed and fabricated so as to have a particular desired equivalent series resistance according to the user demands and application products. This problem also arises with the above-mentioned material altering method.

Thus, the related art ESR adjustment methods have difficulty in fabricating individual products that may satisfy various ESR characteristics according to user demand and the conditions of the application products at the capacitor manufacture side. At the capacitor user side, the user must select individual products according to his desired or required ESR conditions.

SUMMARY OF THE INVENTION

An aspect of the present invention provides a multilayer chip capacitor (MLCC) having a new structure allowing a user to directly adjust required equivalent series resistance (ESR) characteristics according to usage conditions.

Another aspect of the present invention provides a method for fabricating an assembly for an MLCC such as a circuit board having a multilayer capacitor capable of allowing a user to implement desired ESR characteristics by selecting the number and locations of outer electrodes connected with a power line in a mounting stage.

According to an aspect of the present invention, there is provided a multilayer chip capacitor including: a capacitor main body including a plurality of dielectric layers stacked therein; a plurality of first and second inner electrodes alternately disposed such that the inner electrodes having different polarities face each other with the dielectric layers interposed therebetween within the capacitor main body; and m (m≥3) number of first and second outer electrodes formed such that the same number of first and second outer electrodes are formed on the both opposing surfaces of the capacitor main body.

The plurality of first and second inner electrodes are connected with two outer electrodes positioned on both opposing surfaces and having the same polarity as that of the first and second inner electrodes, and classified into a plurality of groups depending on the locations of the outer electrodes connected to the first and second inner electrodes. At least one of two outer electrodes connected with inner electrodes of each group is different from an outer electrode connected with inner electrodes of a different group having the same polarity, and inner electrodes of one group are connected to outer electrodes connected with at least another one group so that all the inner electrodes belonging to the same polarity can be electrically connected.

The first and second outer electrodes may be arranged such that outer electrodes with different polarities are positioned at corresponding regions of both side surfaces. The first and second outer electrodes may be arranged such that outer electrodes with different polarities are adjacent on the same side surface.

When four or more first and second outer electrodes are provided, inner electrodes of each group may be connected with two outer electrodes closest between the both opposing side surfaces.

The first outer electrodes may be four outer electrodes indicated by (A1) to (D1), and the second outer electrodes may be four outer electrodes indicated by (A2) to (D2).

When the first and second outer electrodes are arranged in the order of (A1)-(B2)-(C1)-(D2) and (A2)-(B1)-(C2)-(D1), the first inner electrodes may be classified into a group of first inner electrodes connected with the first outer electrodes of (A1) and (B1), a group of first inner electrodes connected with the first outer electrodes of (B1) and (C1), and a group of first inner electrodes connected with the first outer electrodes of (C1) and (D1), and the second inner electrodes are classified into a group of inner electrodes connected with the second outer electrodes of (A2) and (B2), a group of inner electrodes connected with the second outer electrodes of (B2) and (C2), and a group of inner electrodes connected with the second outer electrodes of (C2) and (D2).

According to another aspect of the present invention, there is provided a method for fabricating a multilayer chip capacitor assembly, including: providing the multilayer chip capacitor as described above; selecting first and second outer electrodes to be connected to a power source from among the first and second outer electrodes of the multilayer chip capacitor in order to obtain a desired equivalent series resistance (ESR); and mounting the multilayer chip capacitor on a printed circuit board (PCB) such that only the selected first and second outer electrodes are connected with power source lines provided on the PCB.

The PCB may include a plurality of mounting pads each corresponding to the first and second outer electrodes of the multilayer chip capacitor, and in mounting the multilayer chip capacitor on the PCB, all the first and second outer electrodes may be bonded to each corresponding mounting pad to thereby mount the multilayer chip capacitor on the PCB, and in this case, the power line may be connected only to the mounting pads corresponding to the selected first and second outer electrodes.

In terms of adjusting equivalent series resistance (ESR), in selecting the first and second outer electrodes to be connected to the power source, the first and second outer electrodes, excluding at least one among the plurality of first and second outer electrodes, may be selected.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
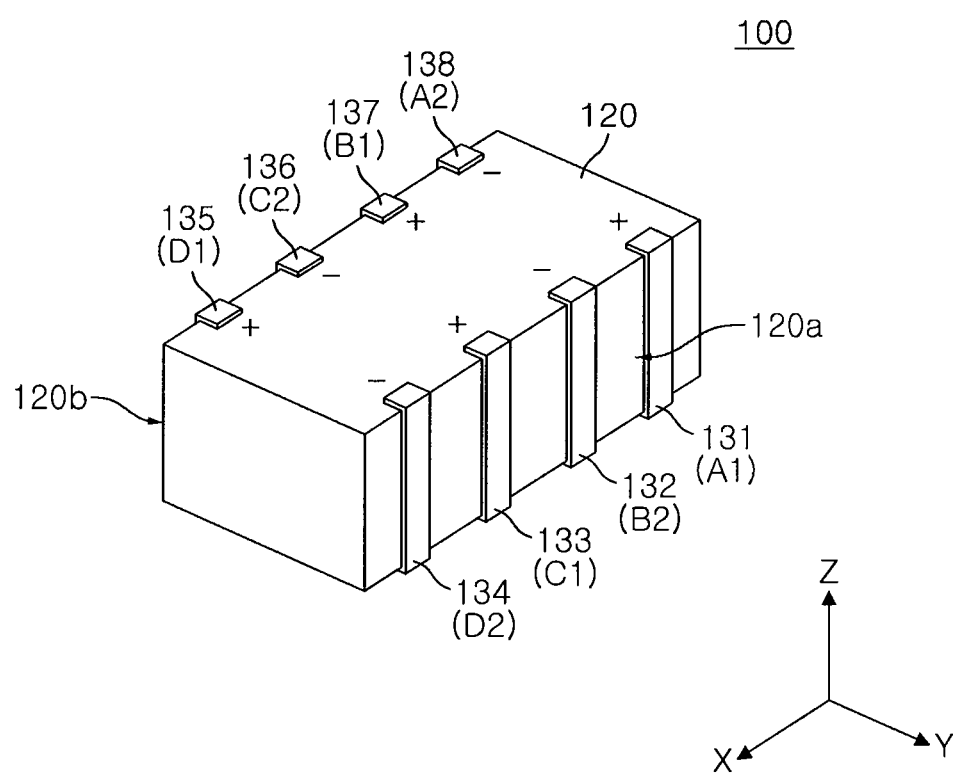
FIG. 1 is a perspective view of a multilayer chip capacitor (MLCC) according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

In general, an equivalent series resistance (ESR) of a multilayered chip capacitor (MLCC) may be represented by equation shown below by using resistance ($R_{electrode}$) of a single inner electrode and the total number of stacked layers (N):

$$ESR = \frac{R_{electrode}}{N}$$

As noted in the above equation, when the number of inner electrodes increases, the ESR of the MLCC decreases. Accordingly, in order to adjust the ESR while maintaining the overall capacity, it is necessary to adjust the number of inner electrodes affecting the ESR while maintaining the total number of inner electrodes affecting the capacity.

An MLCC according to an exemplary embodiment of the present invention will now be described with reference to the accompanying drawings.

FIG. 1 illustrates an example of the structure of an eight-terminal MLCC according to an exemplary embodiment of the present invention.

As shown in FIG. 1, the MLCC 100 according to the present exemplary embodiment includes a capacitor body 120 and first and second outer electrodes 131 to 138 formed on the surface of the capacitor body 120.

The capacity body 120 is formed by stacking a plurality of dielectric layers. A plurality of first and second inner electrodes (1010, 1020, 1030, 1040, 1050, 1060) are separated by dielectric layers 1000. The first and second inner electrodes 1010 and 1020 with different polarities are alternately disposed in a facing manner with the dielectric layer 1000 interposed therebetween to form capacitance.

In the present exemplary embodiment, four first outer electrodes 131, 133, 135, 137, and four second outer electrodes 132, 134, 136, and 138 are provided. The outer electrodes with different polarities may be alternately disposed on one side surface 120a and on the other side surface 120b opposing the one side surface 120a.

Namely, as shown in FIG. 1, the first and second outer electrodes 131 to 138 may be arranged such that those with different polarities are positioned at the corresponding regions of the both side surfaces 120a and 120b and those with different polarities are positioned to be adjacent on the same side surface.

The first and second inner electrodes 1010 to 1060 may be connected with two outer electrodes positioned at both side surfaces 120a and 102b opposing each other and having the same polarity, and may be classified into a plurality of groups depending on the positions of the outer electrodes to which the inner electrodes are directly connected.

Preferably, the inner electrodes of each group may be connected to two outer electrodes positioned to be closest between the two side surfaces and having the same polarity.

In the present exemplary embodiment, the inner electrodes and the outer electrodes may be connected by leads extending from (or drawn out of) the inner electrodes, and in this case, each of the inner electrodes 1010 to 1060 may have a total of two leads (1010a and 101b, 1020a and 1020b, 1030a and 1030b, 1030a and 1030b, 1040a and 1040b, 1050a and 1050b, 1060a and 1060b). Among the two leads (e.g., 1010a and 1010b), one (e.g., 1010a) extends to one side surface 120a, and the other extends to the other side surface 120b opposing the one side surface 120a.

Figure 2:
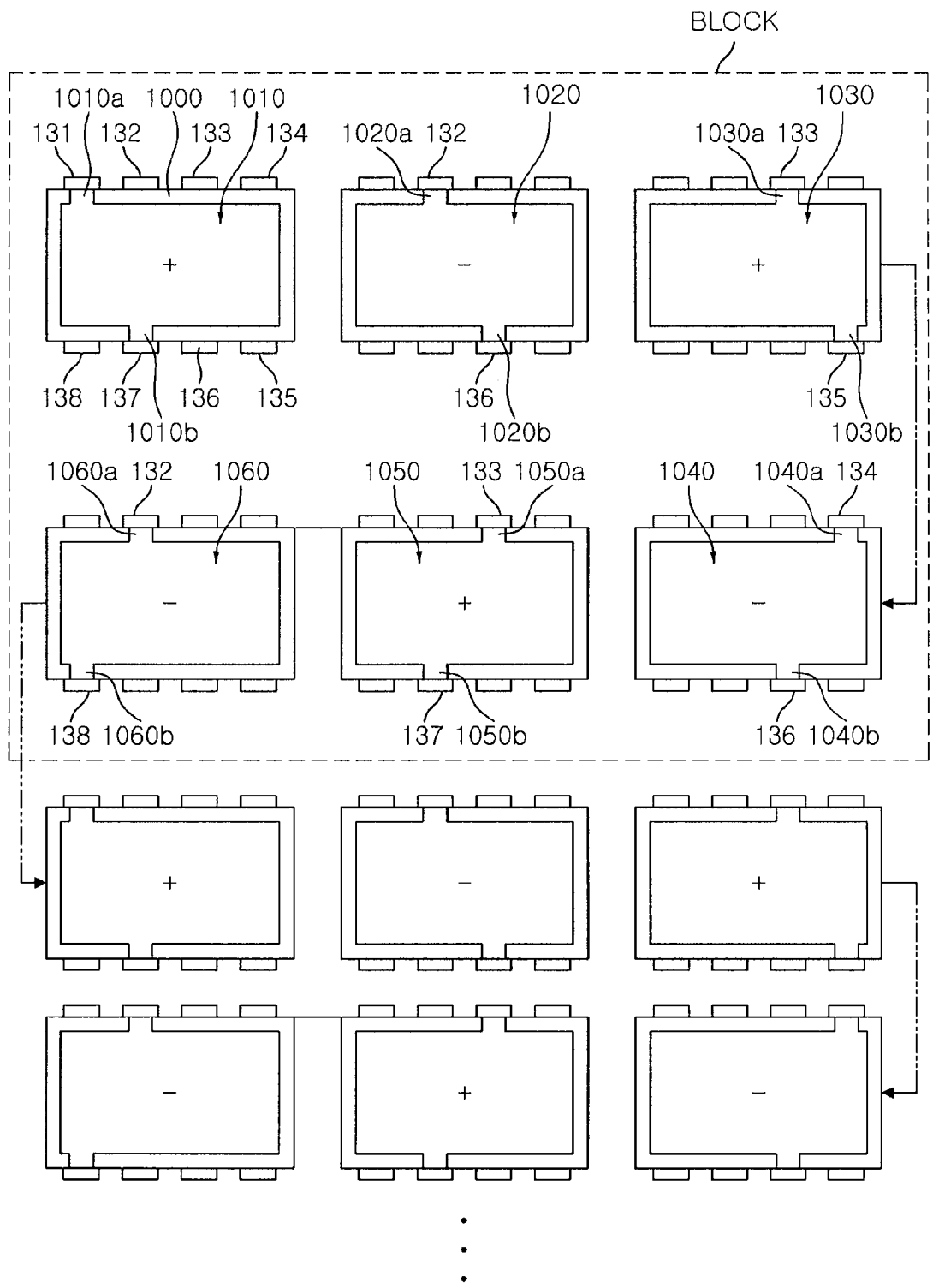
FIG. 2 is a plan view showing first and second inner electrodes preferably employed for the MLCC of FIG. 1.

As shown in FIG. 2, as for the respective inner electrodes 1010 to 1060, the lead extending to one side surface is offset over the lead extending to another side surface by the width of the next outer electrode. For example, the lead 1010a extending to one side surface is offset by the width of the next outer electrode over the lead 1010b extending to another side surface.

Because the two leads in the offset disposition are disposed in zigzags along the stacking direction and while the inner electrodes with the same polarity are directly connected with the outer leads belonging to different groups, they can be electrically connected within the overall capacitor 100.

For example, the inner electrode 1010 with a positive (+) polarity belonging to a first group is electrically connected with the inner electrode 1050 with a positive (+) polarity belonging to the third group via the outer electrode 137 connected to the lead 1010b, and the inner electrode 1050 with the positive (+) polarity belonging to a second group is electrically connected with the inner electrode 1030 with the positive (+) polarity belonging to the second group via the outer electrode 133 connected to the lead 1050a. Accordingly, all the inner electrodes with the positive (+) polarity, namely, the inner electrodes 1010, 1030, 1050 belonging to the first to third groups, are electrically connected within the MLCC 100.

Also, the inner electrode 1020 with a negative (−) polarity belonging to the first group is electrically connected with the inner electrode 1060 with a negative (−) polarity belonging to the second group via the second outer electrode 132 connected to the lead 1020a, and it is also electrically connected with the inner electrode 1040 with a negative (−) polarity belonging to the third group via the outer electrode 136 connected to the lead 1020b. Accordingly, all the inner electrodes with the negative (−) polarity, namely, the inner electrodes 1020, 1040, 1060 belonging to the first to third groups, are electrically connected within the MLCC 100.

The outer electrodes and the inner electrodes employed according to an exemplary embodiment of the present invention can be also described in another aspect as follows.

The four first and second outer electrodes 131,133,135,137 and 132,134,136,138 are indicated by (A1) to (D1) and (A2) to (D2). The first and second outer electrodes 131 to 138 are arranged in the order of (A1)-(B2)-(C1)-(D2) and (A2)-(B1)-(C2)-(D1) along one direction (i.e., x direction) on both side surfaces 120a and 120b of the capacitor main body 120.

In this case, as shown in FIG. 2, the first inner electrodes are classified into the inner electrode 1010 of a group connected to the first outer electrodes (A1) and (B1), the inner electrode 1030 of a group connected to the first outer electrodes (B1) and (C1), and the inner electrode 1050 of a group connected to the first outer electrodes (C1) and (D1).

Also, the second inner electrodes are classified into the inner electrode 1020 of a group connected to the second outer electrodes (A2) and (B2), the inner electrode 1040 of a group connected to the second outer electrodes (B2) and (C2), and the inner electrode 1060 of a group connected to the second outer electrodes (C2) and (D2).

In this manner, the first and second inner electrodes 1010 to 1060 can be sequentially stacked as one set as indicated by a block in FIG. 2. Namely, the set indicated by the block can be understood as a basic unit periodically repeatedly stacked.

The six inner electrodes 1010 to 1060 may be disposed in the proper order along the stacking direction (See the alternated long and short dash lines) to form the MLCC whose ESR can be adjusted.

In the present exemplary embodiment, the case where the six successive inner electrodes 1010, 1020, 1030, 1040, 1050, 1060 are stacked in the order indicated by the dotted line, starting from the first inner electrode 1010 of one group, to form the single capacitor is taken as an example, but the start point of the basic unit (block) can be arbitrarily determined.

For example, six successive inner electrodes 1020, 1030, 1040, 1050, 1060, 1010, starting from the second inner electrode 1020 of one group, may be set as a block.

No matter which inner electrode of a certain group is determined as a start point to set a block, so long as the block includes the six inner electrodes 1010 to 1060 including the first and second inner electrodes of the three groups, it can provide the MLCC according to the exemplary embodiment of the present invention.

With such configuration, desired ESR characteristics can be adjusted according to a selection of an outer electrode connected to a power source, among the plurality of outer electrodes. The adjustment of the ESR characteristics can be arbitrarily selected by the user by adjusting the connection between the outer electrode and the power source in mounting the MLCC on the PCB according to an exemplary embodiment of the present invention.

FIGS. 3a to 3d are perspective views showing an MLCC assembly including the MLCC of FIG. 1 mounted on a printed circuit board (PCB). Here, the MLCC assembly refers to a component obtained by combining a PCB employed for an electronic part and an MLCC mounted on the PCB.

Figure 3A:
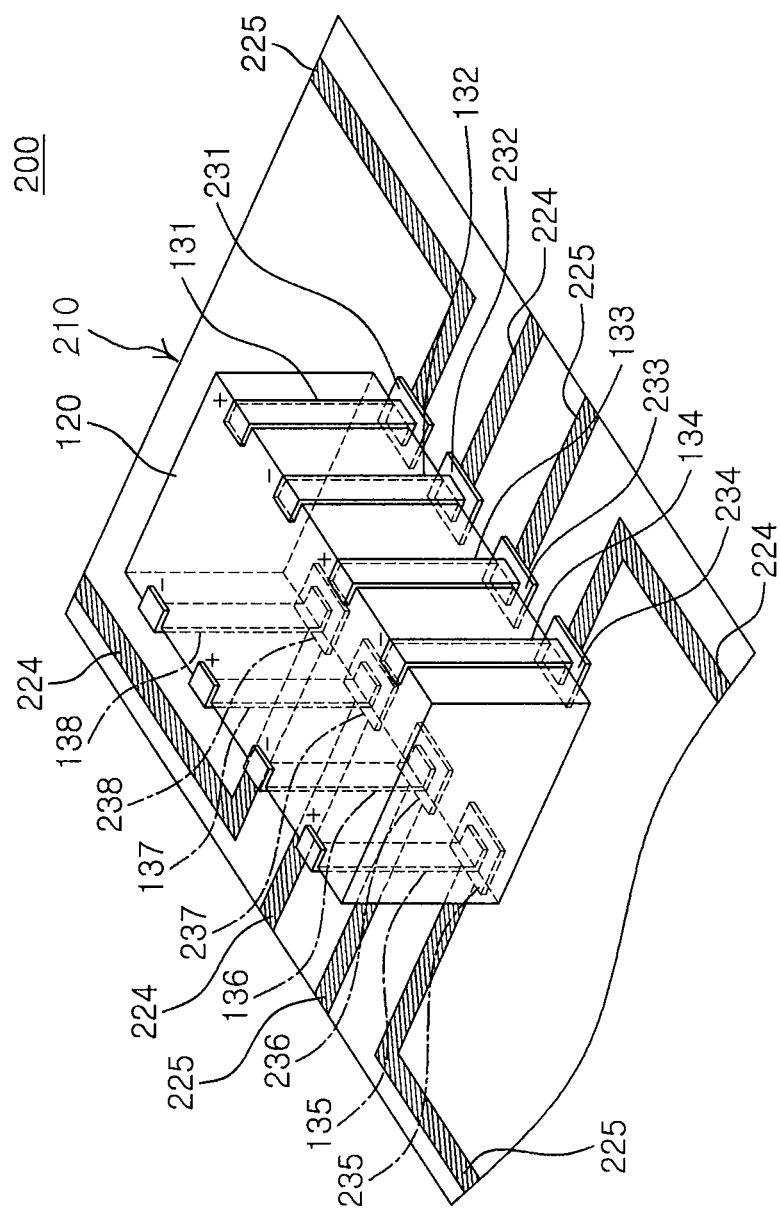
FIGS. 3a to 3d are perspective views showing an MLCC assembly including the MLCC of FIG. 1 mounted on a printed circuit board (PCB)

FIG. 3a shows an MLCC assembly including a PCB 210 with the MLCC 100 illustrated in FIG. 1 mounted thereon.

Six mounting pads 231 to 238 are provided to regions corresponding to the first and second outer electrodes 131 to 138 of the MLCC 100. The first and second outer electrodes 131 to 138 are connected by soldering to the six mounting pads 231 to 238.

In the present exemplary embodiment, connection between power source lines and the outer electrodes is determined according to a connection of the mounting pads. Namely, all the outer electrodes of the MLCC 100 are soldered to the mounting pads and first and second power source lines 225 and 224 are selectively connected to the mounting pads 231 and 238, thereby utilizing at least a portion (some) of the outer electrodes as substantial external terminals.

According to such a connection method, the MLCC can be stably supported by soldering the outer electrodes with the six mounting pads, while only desired outer electrodes can be selectively connected with the power source lines.

Figure 4:
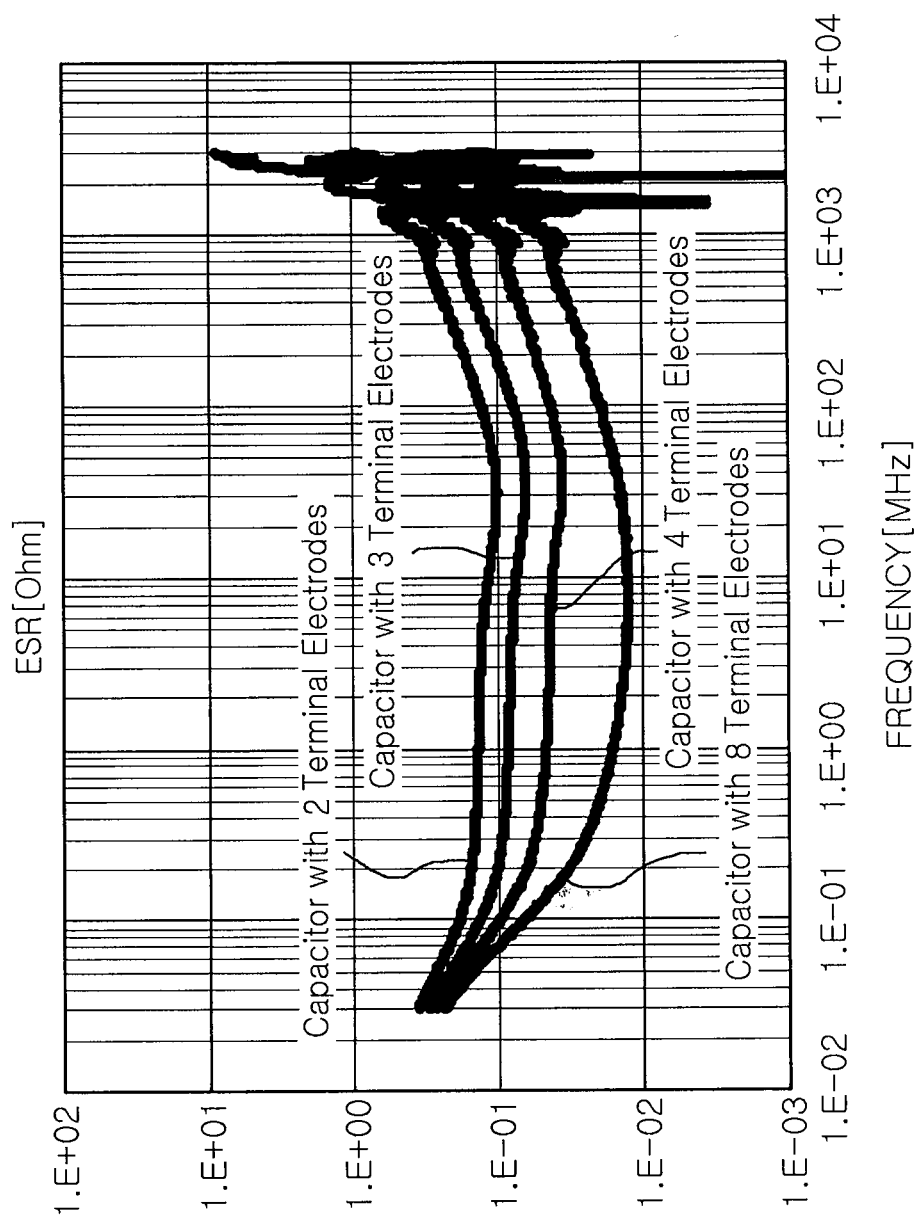
FIG. 4 is a graph showing equivalent series resistance (ESR) changing according to the connection forms illustrated in FIGS. 3a to 3d according to an exemplary embodiment of the present invention.

As shown in FIG. 3a, the first and second power source lines 225 and 224 of the PCB 210 are connected with the six mounting pads 231, 232, 234, 235, 237, 238. Accordingly, as shown in FIG. 4, the resistance component corresponding to the inner electrodes of all the groups connected to the first and second outer electrodes 131 to 138 can be connected in series and the lowest ESR value that can be implemented by he MLCC can be obtained. Also, as shown in FIG. 5, the MLCC can have the lowest ESL value.

Figure 3B:
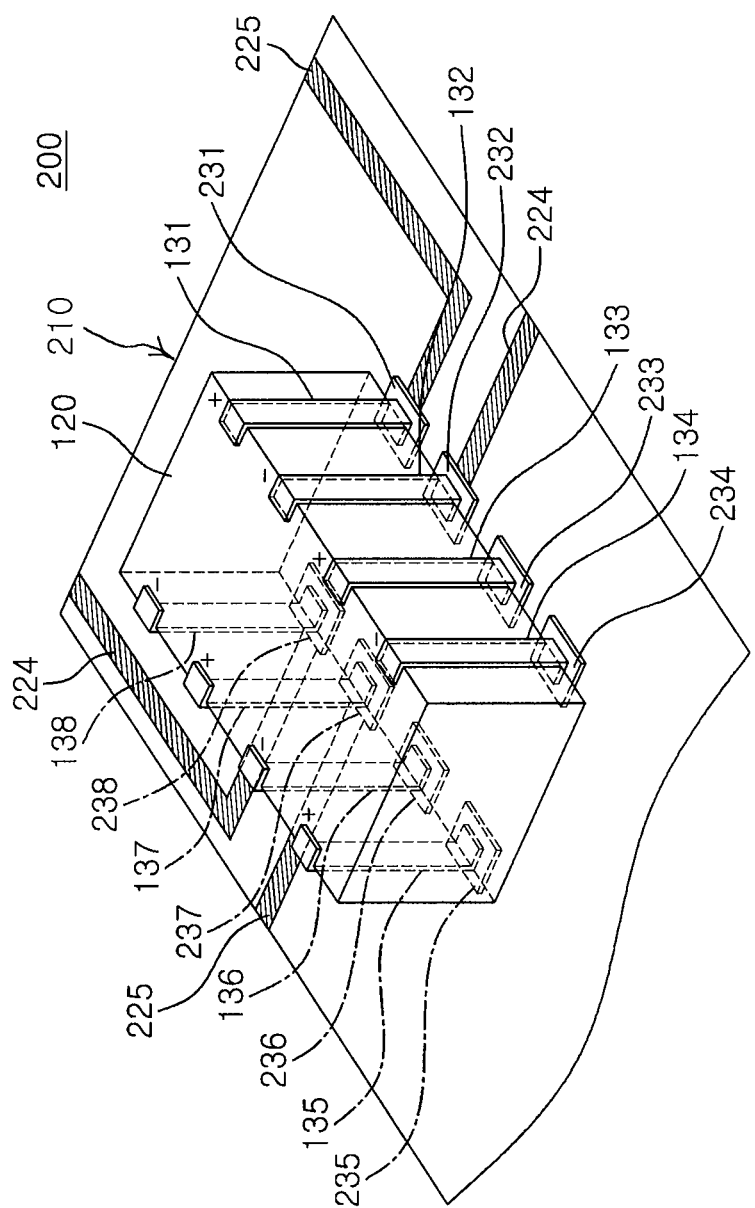

Alternatively, as shown in FIG. 3b, the first and second power lines 225 and 224 of the PCB 210 are connected only to the two first and second mounting pads 231, 237 and 232, 238 at one side, among the six first and second mounting pads 231, 232, 234, 235, 237, 238.

In this case, the other two first and second outer electrodes 133 and 135 and 134 and 136 are not directly connected with the power lines, but because the first and second outer electrodes 131, 137 and 132, 138 are directly connected with the power lines, only the resistance components of the relevant first and second inner electrodes 1010, 1050 and 1020, 1060 can be connected in series.

Figure 5:
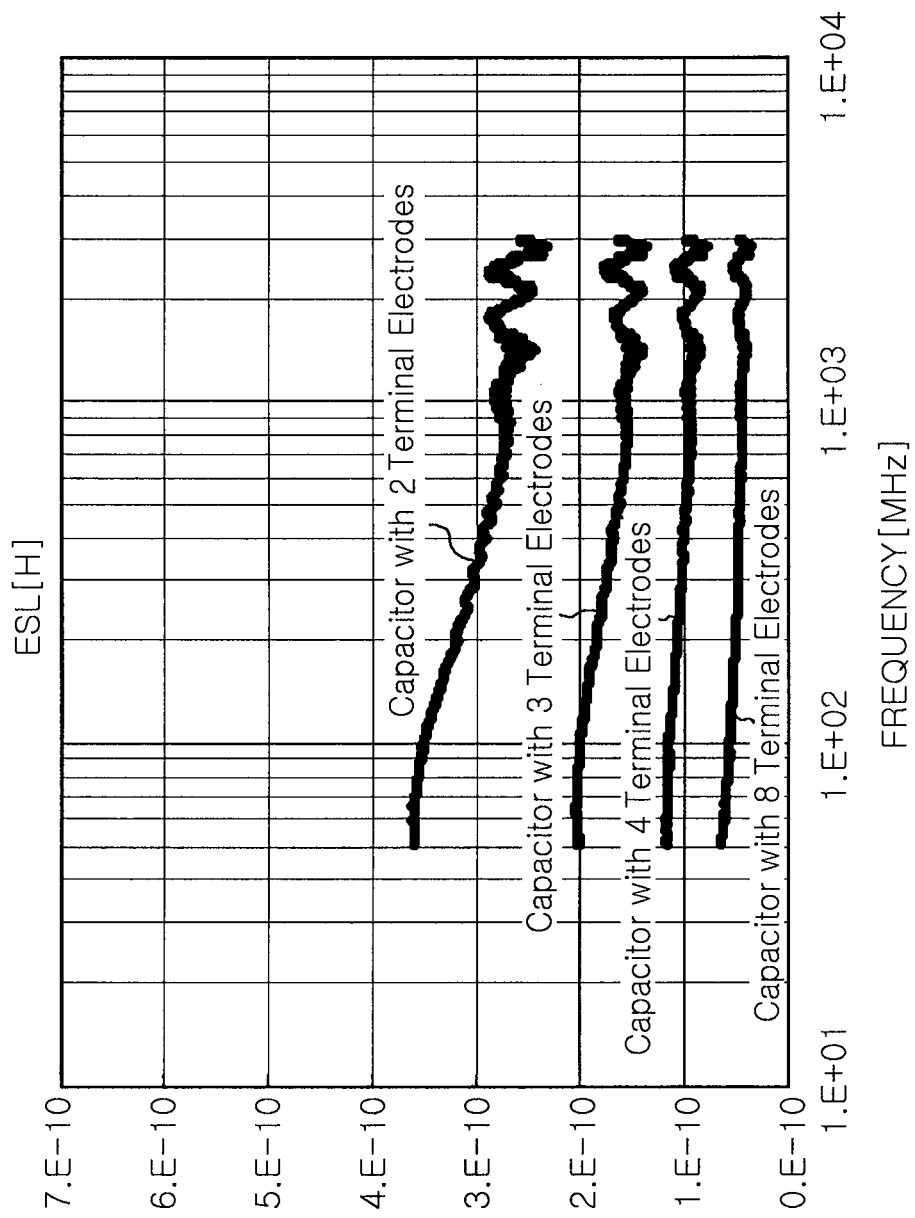
FIG. 5 is a graph showing an equivalent series inductance (ESL) changing according to the connection forms illustrated in FIGS. 3a to 3d according to an exemplary embodiment of the present invention.

Accordingly, the MLCC assembly as shown in FIG. 3b exhibits ESR and ESL values lower than those of the MLCC assembly of FIG. 3a (See FIGS. 4 and 5). Of course, because all the inner electrodes are electrically connected to each other, the overall capacitance value can be maintained to be the same as that of the MLCC illustrated in FIG. 3a.

Figure 3C:
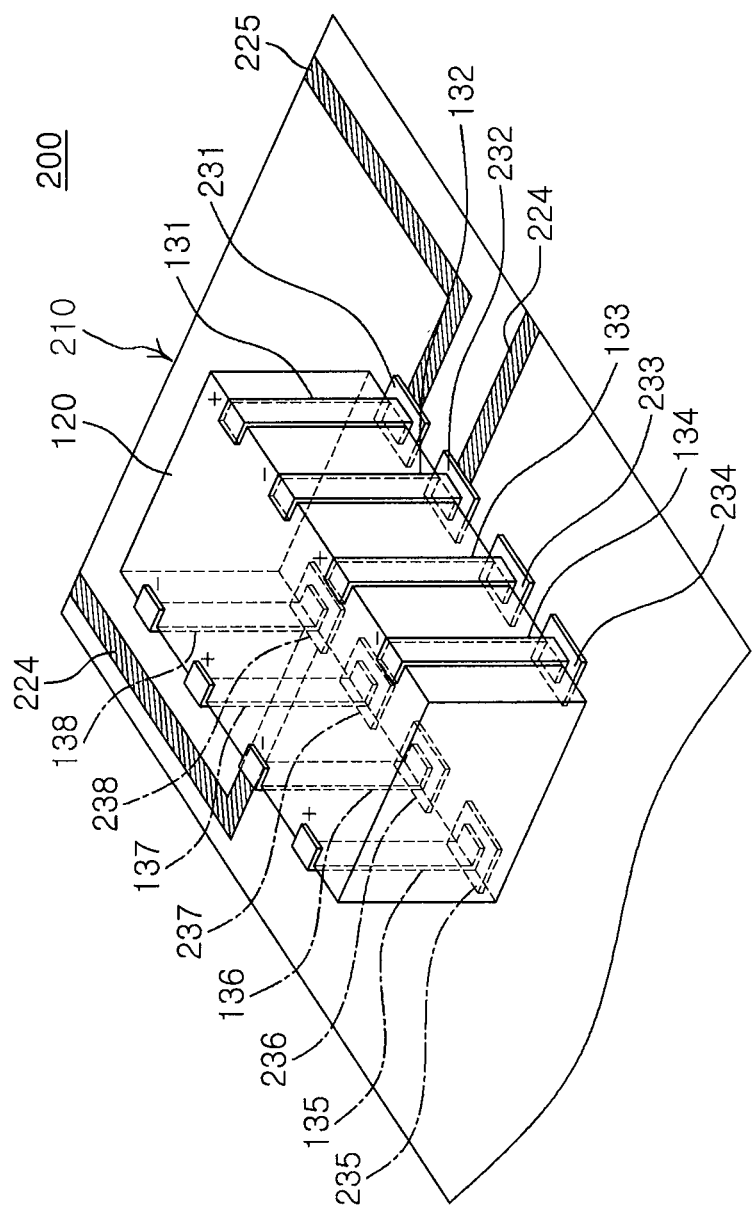

With reference to FIG. 3c, the first and second power lines 225 and 224 on the PCB 210 are connected only with one first mounting pad 231 and two second mounting pads 232 and 238. Thus, because one first outer electrode 131 and two second outer electrodes 132 and 138 are directly connected with the first and second power lines 225 and 224, only the resistance components of the relevant first and second inner electrodes 1010, 1050 and 1020, 1060 can be connected in series.

In this case, because all the inner electrodes are electrically connected to each other, the overall capacitance value can be maintained to be the same as those of the MLCCs illustrated in FIGS. 3a and 3b. Meanwhile, the MLCC assembly of FIG. 3c exhibits ESR and ESL values lower than those of the MLCC assemblies of FIGS. 3a and 3b (See FIGS. 4 and 5).

Figure 3D:
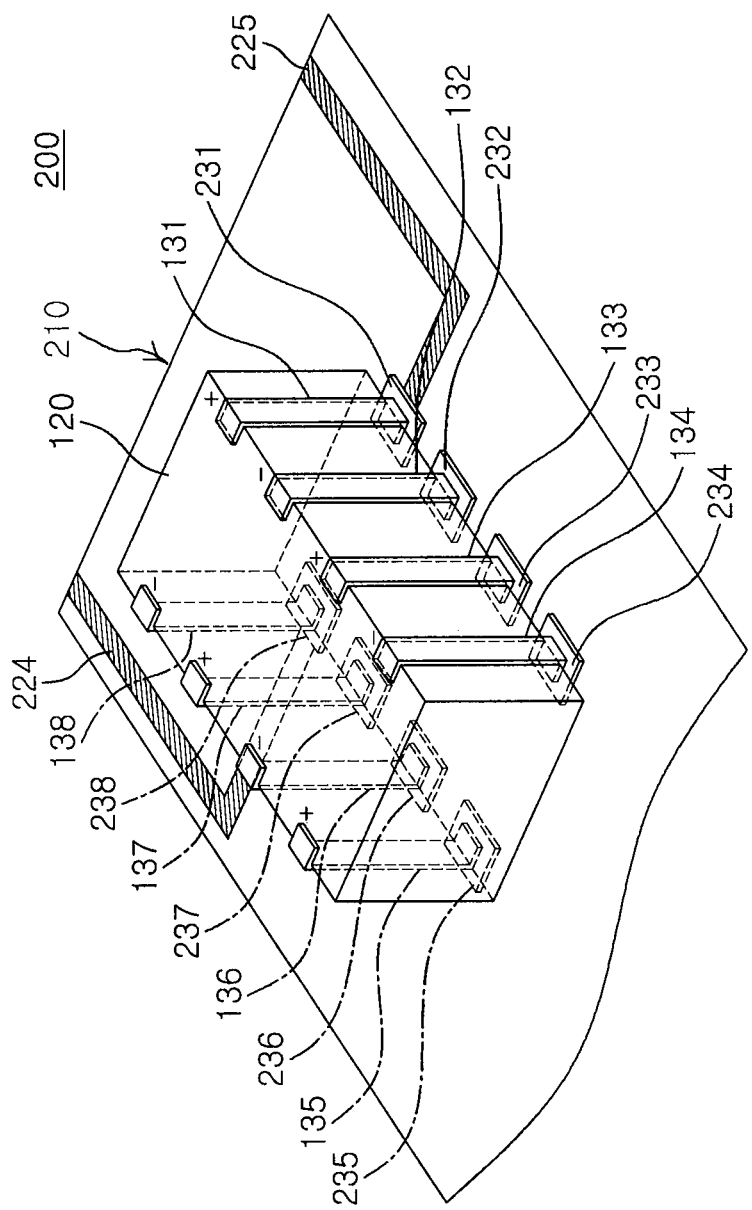

With reference to FIG. 3d, the first and second power lines 225 and 224 on the PCB 210 are connected only to the each one of the first and second mounting pads 231 and 238.

In this case, although the other three first and second outer electrodes 133, 135, 137 and 132, 134, 136 are not directly connected with the power lines, but because the one first and second outer electrodes 131 and 138 are directly connected with the power lines, only the resistance components of the relevant first and second inner electrodes 1010 and 1060 can be connected in series.

Accordingly, the lowest ESR and ESL values can be obtained from the MLCC according to the present exemplary embodiment (See FIGS. 4 and 5). Of course, because all the inner electrodes are electrically connected to each other, the overall capacitance value can be maintained to be the same as that of the MLCC illustrated in FIG. 3a.

In this manner, in the MLCCs according to the exemplary embodiments of the present invention, because the outer electrodes connected with power source lines can be adjusted, the user can arbitrarily select desired ESR characteristics.

As set forth above, according to exemplary embodiments of the invention, when the multilayer chip capacitor (MLCC) is mounted, the ESR characteristics of the capacitor can be variably changed according to selection of outer electrodes to be connected to an external power source circuit. Thus, manufacturers can provide a multilayer chip capacitor satisfying various ESR characteristics as a single chip and users can easily determine desired ESR characteristics by simply and selectively connecting outer electrodes and the power source circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for fabricating a multilayer chip capacitor assembly, the method comprising:
   providing the multilayer chip capacitor;
   selecting a first portion of the first outer electrodes to be directly connected to a power source among the first outer electrodes of the multilayer chip capacitor and excluding a second portion of the first outer electrodes from being directly connected to the power source, in order to obtain a desired equivalent series resistance (ESR);
   selecting a portion of second outer electrodes to be connected to a power source among the second outer electrodes of the multilayer chip capacitor in order to obtain the desired ESR; and
   mounting the multilayer chip capacitor on a printed circuit board (PCB) such that only the selected first and second outer electrodes are connected with power source lines provided on the PCB, wherein:
   the multilayer chip capacitor comprises:
      a capacitor main body including a plurality to dielectric layers stacked therein;
      a plurality of first and second inner electrodes alternately disposed such that the inner electrodes having different polarities facing each other with the dielectric layers interposed therebetween within the capacitor main body; and
      m (m>3) number of first and second outer electrodes formed such that the same number of first and second outer electrodes are formed on both opposing surfaces of the capacitor main body,
   the plurality of first and second inner electrodes are connected to two of the first and second outer electrodes positioned on both opposing surfaces and having the same polarity as that of the first and second inner electrodes, and classified into a plurality of groups depending on locations of the outer electrodes connected to the first and second inner electrodes, and
   at least one of two outer electrodes connected to inner electrodes of each group is different from an outer electrode connected to inner electrodes of a different group having the same polarity, and inner electrodes of one group are connected to outer electrodes connected to at least another one group so that all the inner electrodes belonging to the same polarity can be electrically connected.

2. The method of claim 1, wherein the PCB comprises a plurality of mounting pads each corresponding to the first and second outer electrodes of the multilayer chip capacitor, and in mounting the multilayer chip capacitor on the PCB, all the first and second outer electrodes are bonded to each corresponding mounting pad to thereby mount the multilayer chip capacitor on the PCB, and in this case, the power line may be connected only to the mounting pads corresponding to the selected first and second outer electrodes.

3. The method of claim 2, wherein, in selecting the first and second outer electrodes to be connected to the power source, the first and second outer electrodes, excluding at least one among the plurality of first and second outer electrodes, are selected.

4. The method of claim 1, wherein all of the first outer electrodes are connected to the power source.

5. The method of claim 1, wherein all of the second outer electrodes are connected to the power source.

6. The method of claim 1, wherein only one of the first outer electrodes is connected to the power source among the first outer electrodes of the multilayer chip capacitor.

7. The method of claim 1, wherein only one of the second outer electrodes is connected to the power source among the second outer electrodes of the multilayer chip capacitor.

* * * * *